United States Patent [19]

Tanaka et al.

[11] Patent Number: 5,237,534
[45] Date of Patent: Aug. 17, 1993

[54] DATA SENSE CIRCUIT FOR A SEMICONDUCTOR NONVOLATILE MEMORY DEVICE

[75] Inventors: Sumio Tanaka, Tokyo; Toshiyuki Sanko, Kawasaki, both of Japan

[73] Assignee: Kabushiki Kaisha Toshiba, Kawasaki, Japan

[21] Appl. No.: 854,793

[22] Filed: Mar. 23, 1992

Related U.S. Application Data

[63] Continuation of Ser. No. 514,269, Apr. 25, 1990, abandoned.

[30] Foreign Application Priority Data

Apr. 27, 1989 [JP] Japan .................. 1-108781

[51] Int. Cl.$^5$ .................. G11C 7/06; G11C 16/06
[52] U.S. Cl. .................. 365/208; 365/185; 365/189.06; 365/203; 365/210
[58] Field of Search .................. 365/189.06, 189.09, 365/202, 203, 204, 205, 207, 208, 210, 230.03, 185; 307/355, 530

[56] References Cited

U.S. PATENT DOCUMENTS

| | | | |
|---|---|---|---|
| 4,082,966 | 4/1978 | Lou .................. | 365/103 |
| 4,387,447 | 6/1983 | Klaas et al. .................. | 365/203 |
| 4,494,020 | 1/1985 | Konishi .................. | 365/208 |
| 4,611,301 | 9/1986 | Iwahashi et al. .................. | 365/207 |
| 4,649,301 | 3/1987 | Van Tran .................. | 307/530 |
| 4,656,608 | 4/1987 | Aoyama .................. | 365/203 |
| 4,694,429 | 9/1987 | Tanalta et al. .................. | 365/189.06 |
| 4,725,984 | 2/1988 | Ip et al. .................. | 365/185 |
| 4,802,138 | 1/1989 | Shimamune .................. | 365/870 |
| 4,819,212 | 4/1989 | Nakai et al. .................. | 365/207 |
| 4,839,860 | 6/1989 | Shinoda et al. .................. | 365/230.03 |
| 4,858,194 | 8/1989 | Terada et al. .................. | 365/203 |
| 4,879,689 | 11/1989 | Atsumi et al. .................. | 365/185 |
| 4,881,203 | 11/1989 | Wantabe et al. .................. | 365/203 |
| 4,903,235 | 2/1990 | Kubota et al. .................. | 365/203 |
| 4,916,665 | 4/1990 | Atsumi et al. .................. | 365/208 |
| 4,970,691 | 11/1990 | Atsumi et al. .................. | 365/208 |
| 4,972,378 | 11/1990 | Kitagawa et al. .................. | 365/185 |
| 5,001,668 | 3/1991 | Ito et al. .................. | 365/185 |
| 5,068,831 | 11/1991 | Hoshi et al. .................. | 365/203 |
| 5,117,394 | 5/1992 | Amin et al. .................. | 365/202 |

*Primary Examiner*—Joseph L. Dixon
*Assistant Examiner*—Jack A. Lane
*Attorney, Agent, or Firm*—Banner, Birch, McKie & Beckett

[57] ABSTRACT

The current paths of column selection transistors are inserted between a pair of input nodes, on the one hand, of a sense amplifier constituted by a current-mirror type differential amplifier, and column lines, on the other hand. The current paths of transistors for clamping column potential are inserted between the input nodes of the sense amplifier, on the one hand, and a power source, on the other. The gates of the transistors for clamping column potential are supplied with a bias potential lower than the potential of the power source. When data is read out from selected memory cells, the potential of the input nodes of the sense amplifier is clamped to a value lower than the potential Vcc of the power source by the transistors for clamping column potential. The storage data in the selected memory cells is input directly to the input nodes of the sense amplifier through the current paths of the column selection transistors.

16 Claims, 6 Drawing Sheets

DATA SENSE CIRCUIT FOR A SEMICONDUCTOR NONVOLATILE MEMORY DEVICE

This application is a continuation of application Ser. No. 07/514,269, filed Apr. 25, 1990 now abandoned.

BACKGROUND OF THE INVENTION

1. Field of the Invention

The present invention relates generally to a semiconductor nonvolatile memory device, and more particularly to a data sense circuit for reading out stored data.

2. Description of the Related Art

It is well known that, in an erasable programmable read-only memory, there is a concern that stored data in a memory cell is destroyed (or erroneously written) owing to a voltage stress at the time of data readout. When a given memory cell is selected, a power source potential Vcc is applied to a control gate and a drain of the selected memory cell. When the power source potential is repeatedly applied for a long time, electrons are injected in the floating gate of the memory cell gradually. In order to prevent such erroneous write, or so-called "soft write", the drain potential (column potential) of the memory cell at the time of readout is clamped to a value (e.g. 1.5 V) lower than the power source potential (normally 5 V), thereby enhancing the reliability of data retention by the memory cell. Structures of such a data sense circuit or its peripheral circuit for the EPROM are shown, for example, in 1984 *IEEE International Solid-State Circuits Conference DIGEST OF TECHNICAL PAPERS*, William Ip. Te-Long Chia et al., SESSION X: NONVOLATILE MEMORIES THAM 10.2: 256Kb CMOS EPROM, pp. 138, 139, FIG. 3(b); and 1985 IEEE International Solid-State Circuits Conference DIGEST OF TECHNICAL PAPERS, Saito et al., SESSION XII: NONVOLATILE MEMORIES THAM 13.8: A Programmable 80 ns 1Mb CMOS EPROM, pp. 176, 177, FIG. 2.

In data sense circuits disclosed in these documents, a current path of a transistor for clamping column potential is inserted between a column selection transistor and a power source, and also a current path of a transistor for a transfer gate is inserted between a column selection transistor and a sense line. A bias potential (e.g. 1.5 V) lower than a power source potential is applied to the gate of the column potential clamping transistor and to the gate of the transfer gate transistor. As a result, a drain potential of the memory cell at the time of readout is clamped to about 1.5 V lower than the power source potential.

In the above-described EPROM, when a data sense operation is carried out, data from the selected memory cell is amplified in two stages on the column line side and the sense line side separated by the transfer gate transistor. However, in the case of the two-stage sense system, if the level of data stored in the selected memory cell is low, the transfer gate transistor is located in a discharge path for discharging charge of the column line and the discharge speed is lowered owing to the resistance of the transfer gate transistor. Consequently, the access time increases.

The same problem resides in an electrically erasable programmable read-only memory (EEPROM) employing the two-stage sense system.

SUMMARY OF THE INVENTION

The object of the present invention is to provide a semiconductor nonvolatile memory device having a data sense circuit capable of reading out storage data at high speed, without lowering the data hold reliability of memory cells.

This object is achieved by a semiconductor nonvolatile memory device comprising:

first and second memory cell arrays, in each of which nonvolatile memory cells are arranged in a matrix;

a row decoder for decoding a row address signal and selecting a corresponding row of memory cells in the first and second memory cell arrays;

first column selection transistors having current paths connected at one end to corresponding columns of memory cells in the first memory cell array and at the other end to a first common connection node;

second column selection transistors having current paths connected at one end to corresponding columns of memory cells in the second memory cell array and at the other end to a second common connection node;

a column decoder for decoding a column address signal and selecting a pair of the first column selection transistor and the second column selection transistor;

first transistors for clamping column potential, each having a current path connected at one end to the first common connection node of the first column selection transistor and at the other end to a power source for readout, the gate of each first transistor for clamping column potential being supplied with a bias potential lower than the potential of the readout power source;

second transistors for clamping column potential, each having a current path connected at on end to the second common connection node of the second column selection transistor and at the other end to a power source for readout, the gate of each second transistor for clamping column potential being supplied with the bias potential; and a sense amplifier having a first input node connected to the common connection node of the current path of the first column selection transistor, and having a second input node connected to the common connection node of the current path of the second column selection transistor, the sense amplifier sensing and amplifying data read out from selected memory cells in said first and second memory cell arrays, the threshold voltage of said first and second input nodes of said sense amplifier being lower than a low level of a readout potential for reading out data from the memory cells.

With the above structure, when storage data is read out, the potential of the column lines is clamped to a value lower than the power source potential Vcc by means of the transistors for clamping column potential. Thus, the data hold reliability of the memory cells can be maintained. In addition, the storage data in the selected memory cells is input directly to the input nodes of the sense amplifier through the column selection transistors, and the threshold voltage of the input nodes of the sense amplifier is set to a low value capable of sensing the potential of the column lines. Thus, the data sense operation can be performed without employing a two-stage sense system. Since no transfer gate transistor is provided in a path for discharging the charge of the low-level column lines, the resistance acting between the column lines and the sense amplifier is reduced, whereby the access time can be shortened.

Therefore, there is provided a semiconductor nonvolatile memory device having a data sense circuit capable of reading out storage data at high speed, without lowering the data hold reliability of memory cells.

Additional objects and advantages of the invention will be set forth in the description which follows, and in part will be obvious from the description, or may be learned by practice of the invention. The objects and advantages of the invention ma be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
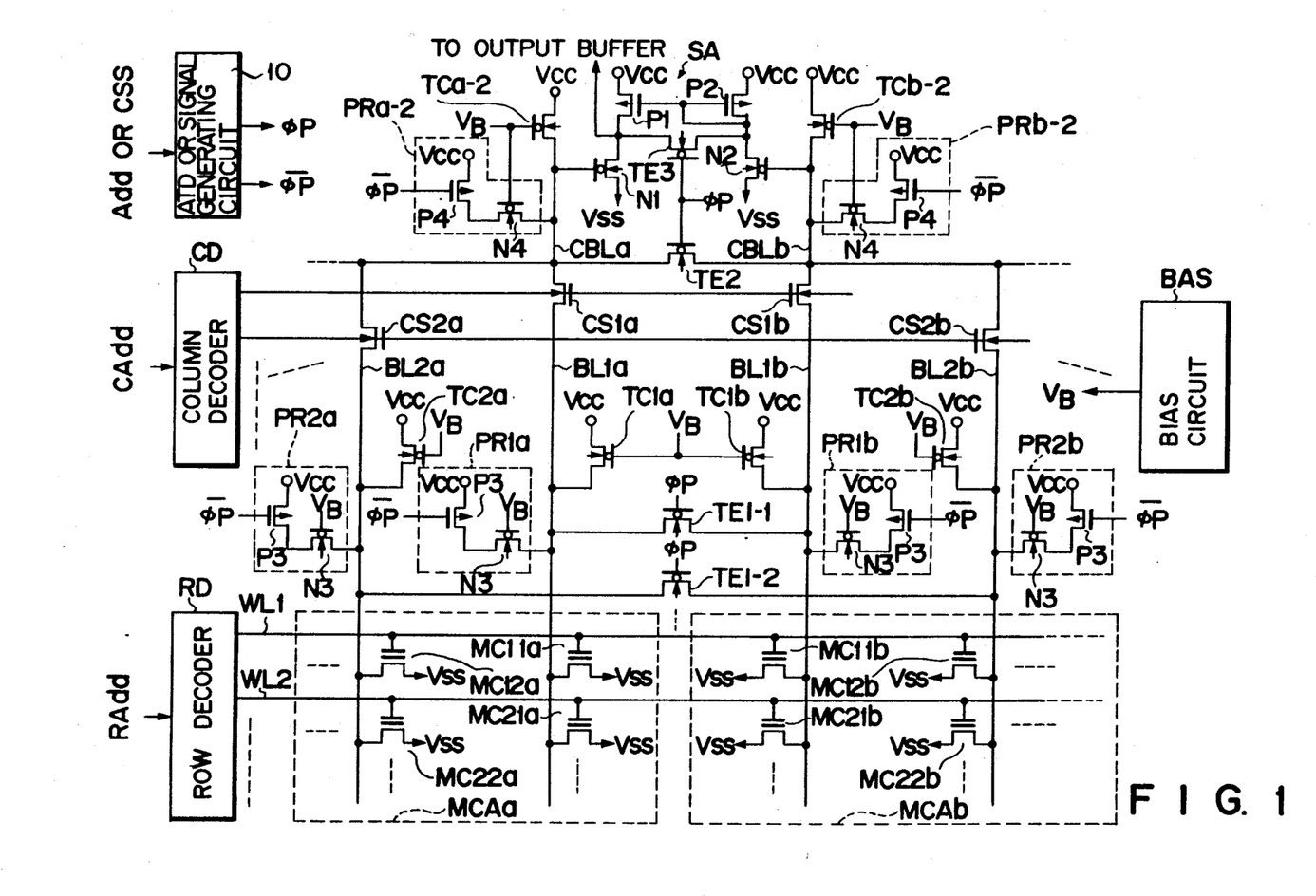
FIG. 1 is a circuit diagram for describing a semiconductor nonvolatile memory device according to a first embodiment of the present invention, and shows a part of an EPROM.

FIG. 1 shows a structure of a data sense circuit and its peripheral circuit in a semiconductor non-volatile memory device or an EPROM according to a first embodiment of the present invention. This EPROM employs a 2 cell/1 bit system in which one-bit data is stored by two memory cells, and two memory cell arrays are provided to write data complementarily. A first memory cell array MCAa comprises EPROM cells (memory cells) MC11a, MC12a . . . constituted by floating gate type MOS transistors, which are arranged in a matrix. A second memory cell array MCAb similarly comprises memory cells MC11b, MC12b . . . constituted by floating gate type MOS transistors which are arranged in a matrix. Data is complementarily written at the mutually corresponding addresses in the first and second memory cell arrays MCAa and MCAb. For example, when a write operation is performed in a memory cell MCa in the first memory cell array MCAa, the write operation is not performed in a corresponding memory cell MCb (i.e. having a corresponding address to that of memory cell MCa) in the second memory cell array MCAb. When the write operation is not performed in the memory cell MCa, the write operation is performed in the corresponding memory cell MCb. Row lines (word lines) WL1, WL2 . . . are connected to corresponding rows of the memory cells MC11a, MC12a, . . . , MC11b, MC12b . . . in the memory cell arrays MCAa and MCAb. A row decoder RD is supplied with a row address signal RAdd and decodes the signal RAdd to select the row lines WL1, WL2 . . . . Column lines (bit lines) BL1a, BL2a . . . are connected to corresponding columns of the memory cells MC11a, MC12a . . . in the first memory cell array MCAa, and column lines BL1b, BL2b . . . are connected to corresponding rows of the memory cells MC11b, MC12b . . . in the second memory cell array MCAb. Current paths of column selection MOS transistors CS1a, CS2a . . . are connected at one end to the column lines BL1a, BL2a . . . and at the other end to a common bit line CBLa. The current paths of column selection MOS transistors CS1b, CS2b . . . are connected at one end to the column lines BL1b, BL2b . . . and at the other end to a common bit line CBLb. A column decoder CD is supplied with a column address signal CAdd and decodes the signal CAdd to select a pair of column selection transistors CSa and CSb connected to mutually corresponding bit lines BLa and BLb in the first and second memory cell arrays MCAa and MCAb. The current paths of first N-channel MOS transistors TC1a, TC2a . . . TC1b, TC2b . . . for clamping column potential are connected between power sources Vcc and columns lines BL1a, BL2a . . . BL1b, BL2b . . . . The gates of MOS transistors TC1a, TC2a . . . TC1b, TC2b . . . are supplied with bias potential $V_B$ output from a bias potential generator (bias circuit) BAS. The bias potential $V_B$ output from the bias circuit BAS is lower than a power source potential Vcc and is equal to a maximum value (e.g. 1.5 V) that does not cause an erroneous write in memory cells owing to long-time voltage stress at the time of readout. The current paths of first N-channel MOS transistors TE1-1, TE1-2 . . . for equalization are connected between pairs of corresponding column lines BL1a and BL1b, BL2a and BL2b . . . in the memory cell arrays MCAa and MCAb. The gates of the MOS transistors TE1-1, TE1-2 . . . are supplied with equalizing signals $\phi p$ output from an address transmission detector (ATD) or signal generating circuit 10. When an ATD is used for the signal generating circuit 10, the ATD is supplied with an address signal Add and detects the transition of the signal Add, thereby generating a pulse-shaped equalizing signal $\phi p$ and a precharge signal $\overline{\phi p}$ or an inverted signal of the signal $\phi p$. In the case where the signal generating circuit 10 is used, it is supplied with a memory chip selection signal CSS, and generates a pulse-shaped equalizing signal $\phi p$ and a precharge signal $\overline{\phi p}$ in synchronization with the signal CSS. Column line precharge circuits PR1a, PR2a . . . PR1b, PR2b . . . are connected between power sources Vcc and corresponding column lines BL1a, BL2a . . . BL1b, BL2b . . . . Each of the column line precharge circuits PR1a, PR2a . . . PR1b, PR2b . . . comprises a P-channel MOS transistor P3 and an N-channel MOS transistor N3. The P-channel MOS transistor P3 and the N-channel MOS transistor N3 is connected in series between the power source Vcc and the bit line BL. The gate of the MOS transistor P3 is supplied with the precharge signal $\overline{\phi p}$ output from the ATD or the signal generating circuit 10, and the gate of the MOS transistor N3 is supplied with the bias potential $V_B$ output from the bias circuit BAS.

The current paths of a pair of second N-channel MOS transistors TCa-2 and TCb-2 for clamping column line potential are connected between the power source Vcc and the pair of common column lines CBLa and CBLb. The gates of these MOS transistors TCa-2 and TCb-2 are supplied with the bias potential $V_B$. The current path of a second N-channel MOS transistor TE2 for equalization is connected between the pair of common column lines CBLa and CBLb. A pair of second column line precharge circuits PRa-2 and PRb-2 are connected between power sources Vcc and the common column lines CBLa and CBLb. Each of the second column line precharge circuits PRa-2 and PRb-2 comprises a P-channel MOS transistor P4 and an N-channel MOS transistor N4 which are connected in series between the power source Vcc and the common bit line CBLa (CBLb). The gate of the MOS transistor P4 is supplied with the precharge signal $\overline{\phi p}$ output from the circuit 10, and the gate of the MOS transistor N4 is supplied with the bias potential $V_B$. The common column lines CBLa and CBLb are connected to two input nodes of a sense amplifier SA constituted by a CMOS current-mirror type differential amplifier comprising P-channel MOS transistors P1 and P2, N-channel MOS transistors N1 and N2, and a third N-channel MOS transistor TE3 for equalization. In other words, the gates of paired N-channel MOS transistors N1 and N2 for input are connected to the common bit lines CBLa and CBLb, and the sources thereof are connected to ground potential Vss. The paired P-channel MOS transistors P1 and P2, which are connected in a current-mirror manner and serve as loads, are connected between the MOS transistors N1 and N2, on the one hand, and the power sources Vcc, on the other. The current path of the MOS transistor TE3 is connected at one end to a node of the MOS transistors P1 and N1, and at the other end to a node of the MOS transistors P2 and N2. The gate of the MOS transistor TE3 is supplied with an equalizing signal $\phi p$. An output signal of the sense amplifier SA, which is output from the node of the MOS transistors P1 and N1 is supplied to an output buffer (not shown). Then, an output signal of the output buffer is supplied to an external section as a readout signal.

Enhancement-type transistors are used as the P-channel MOS transistors P1 to P4. So-called intrinsic-type MOS transistors, having a threshold voltage of substantially 0 V, are used as the N-channel MOS transistors N1 to N4, TC1a, TC2a . . . TC1b, TC2b . . . , TE1-1, TE1-2 . . . TE2 and TE3. In the intrinsic-type MOS transistor, no impurity ions are implanted in a channel region (the concentration of charge carriers is characteristic of the substrate material itself).

Figure 2:
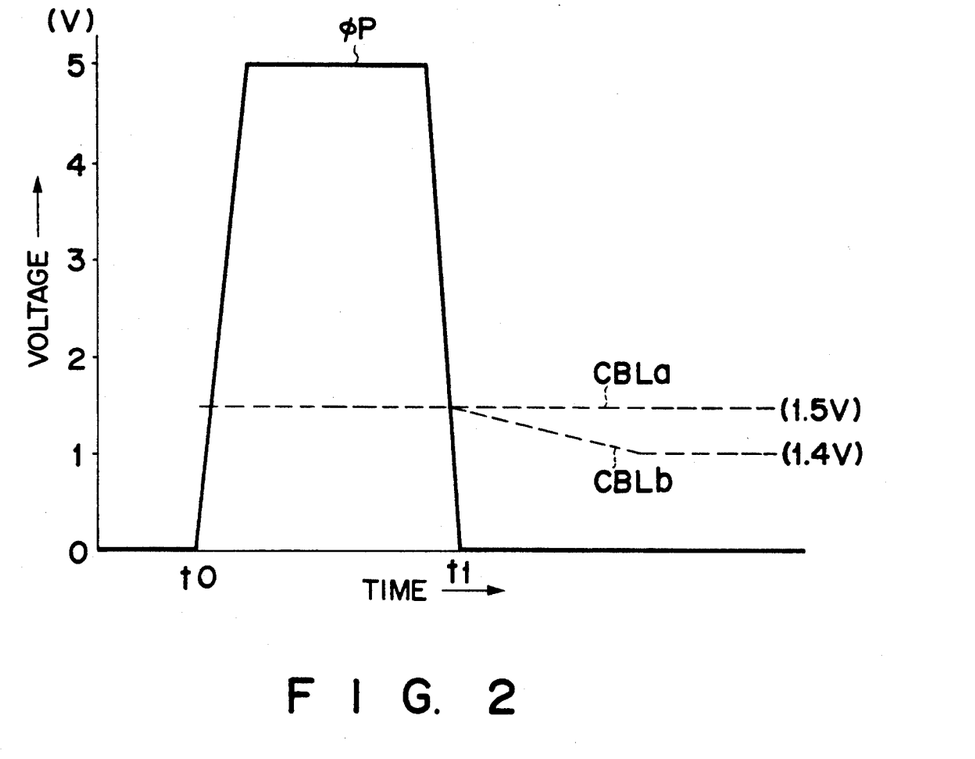
FIG. 2 illustrates a voltage waveform for explaining the data sense operation for the EPROM shown in FIG. 1.

The data sense operation of the EPROM shown in FIG. 1 will now be explained with reference to FIG. 2. Now suppose that the ATD or signal generating circuit 10 has detected the transition of an address signal Add at time instant t0, or a memory chip selection signal CSS has been input to the ATD or signal generating circuit 10. In synchronism with this, the ATD or signal generating circuit 10 generates an equalizing signal $\phi p$ (high level, e.g. 5 V) and a precharge signal $\overline{\phi p}$ (low level, e.g. 0 V) for a short time period (t0 to t1). During the time (t0 to t1) in which the signals $\phi p$ and $\overline{\phi p}$ are being generated, the P-channel MOS transistors P3 of the column line precharge circuits PR1a, PR2a . . . PR1b, PR2b . . . are turned on, and the column lines BL1a, BL2a . . . BL1b, BL2b . . . are precharged by the column line precharge circuits PR1a, PR2a . . . PR1b, PR2b . . . . At this time, the gates of the N-channel MOS transistors N3 of the column line precharge circuits PR1a, PR1b . . . PR2a, PR2b . . . are supplied with bias potential $V_B$ of about 1.5 V from the bias circuit BAS. As a result, the column line potential is almost 1.5 V. Simultaneously, the N-channel MOS transistors TE1-1, TE1-2 . . . TE2, TE3 for equalization are turned on, and an equal potential appears on all column lines BL1a, BL2a . . . BL1b, BL2b . . . , common bit lines CBLa and CBLb, and the paired output nodes of the sense amplifier SA.

At time instant t1, the generation of the equalizing signal $\phi p$ and precharge signal $\overline{\phi p}$ is stopped (i.e. $\phi p$ is 0 V, and $\overline{\phi p}$ is 5 V). Accordingly, all MOS transistors P3 in the column line precharge circuits PR1a, PR2a . . . PR1b, PR2b . . . and all transistors TE1-1, TE1-2 . . . TE2 and TE3 for equalization are turned off. Then, the readout of data in the paired memory cells MCa and MCb selected by the row decoder RD and the column decoder CD is started. In this case, the transistors TC1a, TC2a . . . TC1b, TC2b . . . for clamping column potential prevent the low-level potential of the column lines BL from lowering excessively. The potential difference between the paired column lines BLa and BLb and the potential difference between the paired common column lines CBLa and CBLb are set, for example, to 0.5 V (i.e. the high level/low level of column potential is about 1.5 V/1.0 V), so that these potential differences may not lower excessively owing to the readout potential of the selected pair of memory cells, in consideration of the characteristic of data write in memory cells.

For example, when the row line WL1 is selected by the row decoder RD and the column selection transistors CS1a and CS1b are selected by the column decoder CD, a pair of memory cells MC11a and MC11b are selected. In accordance with the data stored in the memory cells MC11a and MC11b, the potential of the paired column lines BL1a and BL1b varies. The variation in potential is directly transmitted to the input node of the sense amplifier SA through the column selection transistors CS1a and CS1b. Since the intrinsic-type MOS transistors N1 and N2 are used as the input transistors of the sense amplifier SA, the sense amplifier SA can detect a potential difference, even if very low, between the column lines BL1a and BL1b, and can read out data from the memory cells MC11a and MC11b. The sense amplifier is designed such that a sense amplification operation is carried out when the potential difference between the paired input nodes is, for example, 1.5 V (in FIG. 2, CBLa is 1.5 V and CBLb is 1.4 V). The data read out from the selected memory cells is sense and amplified at high speed. The amplified signal from the sense amplifier SA is supplied to the output buffer (not shown), and an output signal from the output buffer is supplied to an external section as a readout signal.

The semiconductor nonvolatile memory device having the structure shown in FIG. 1 is provided with a data sense circuit capable of reading out storage data at high speed, without lowering the data hold reliability of memory cells.

In the circuit shown in FIG. 1, the column lines BL1a, BL2a . . . BL1b, BL2b, common column lines CBLa and CBLb (input nodes of sense amplifier SA), and the output nodes of the sense amplifier SA are equalized prior to the access to the memory cells; however, the advantages of the invention can be attained even if these are not equalized. It should be noted, however, that in the case where the memory cell access speed is slow and there is time for equalizing the potential of the column lines, common column lines, and pair of output nodes of sense amplifier SA, the potential of the paired input nodes and that of output nodes of the sense amplifier SA can be reset by the aforementioned equalizing operation; thus, data readout can be performed at high speed. In addition, the circuit shown in FIG. 1 employs one sense amplifier SA for two memory cell arrays MCAa and MCAb; however, it is of course possible to connect one sense amplifier to each pair of memory cell arrays when two or more pairs of memory cell arrays are provided. Namely, the advantage of the invention are unchanged even if two or more sense amplifiers are provided in a single memory device.

Figure 3A:
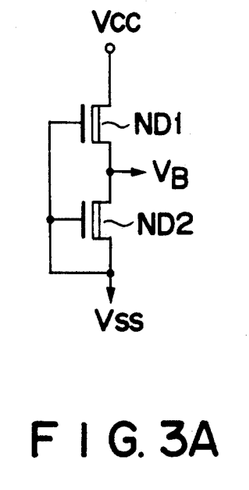
FIGS. 3A to 3C show examples of a bias circuit in the circuit shown in FIG. 1.
Figure 3B:
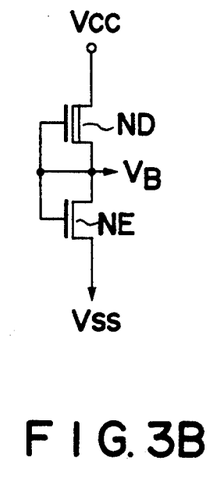
Figure 3C:
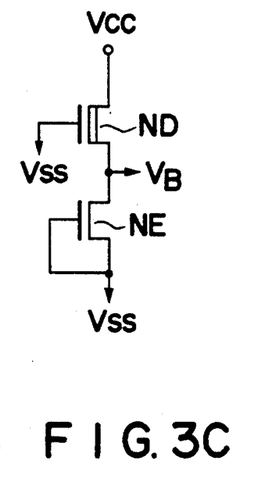

FIGS. 3A to 3C show examples of the structure of the bias circuit BAS employed in the circuit shown in FIG. 1. It is desirable that the bias circuit BAS have a structure that is not influenced by a fluctuation of read-out power source potential, resulting from a peak current due to charge/discharge of an internal circuit and/or an output buffer in the EPROM. The bias circuit BAS is designed to generate a constant bias potential $V_B$, which is not influenced by the power source potential fluctuation.

The bias circuit BAS shown in FIG. 3A comprises two depletion-type N-channel MOS transistor ND1 and ND2, the current paths of which are connected in series between a power source Vcc and a ground potential Vss. The gates of the MOS transistors ND1 and ND2 are connected to the ground potential Vss. The bias potential $V_B$ is output from a node between the MOS transistors ND1 and ND2.

The bias circuit BAS shown in FIG. 3B comprises a depletion-type N-channel MOS transistor ND and an enhancement-type N-channel MOS transistor NE, the current paths of which are connected in series between a power source Vcc and a ground potential Vss. The gate and source of the MOS transistor ND are connected to each other, and the drain and gate of the MOS transistor ED are connected to each other. The bias potential $V_B$ is output from a node between the MOS transistors ND and ED.

The bias circuit BAS shown in FIG. 3C comprises a depletion-type N-channel MOS transistor ND and an enhancement-type N-channel MOS transistor NE, the current paths of which are connected in series between a power source Vcc and a ground potential Vss. The gate the MOS transistor ND is connected to a ground potential Vss, and the drain and the gate of the MOS transistor NE are connected to each other. The bias potential $V_B$ is output from a node between the MOS transistors ND and ED.

Figure 4:
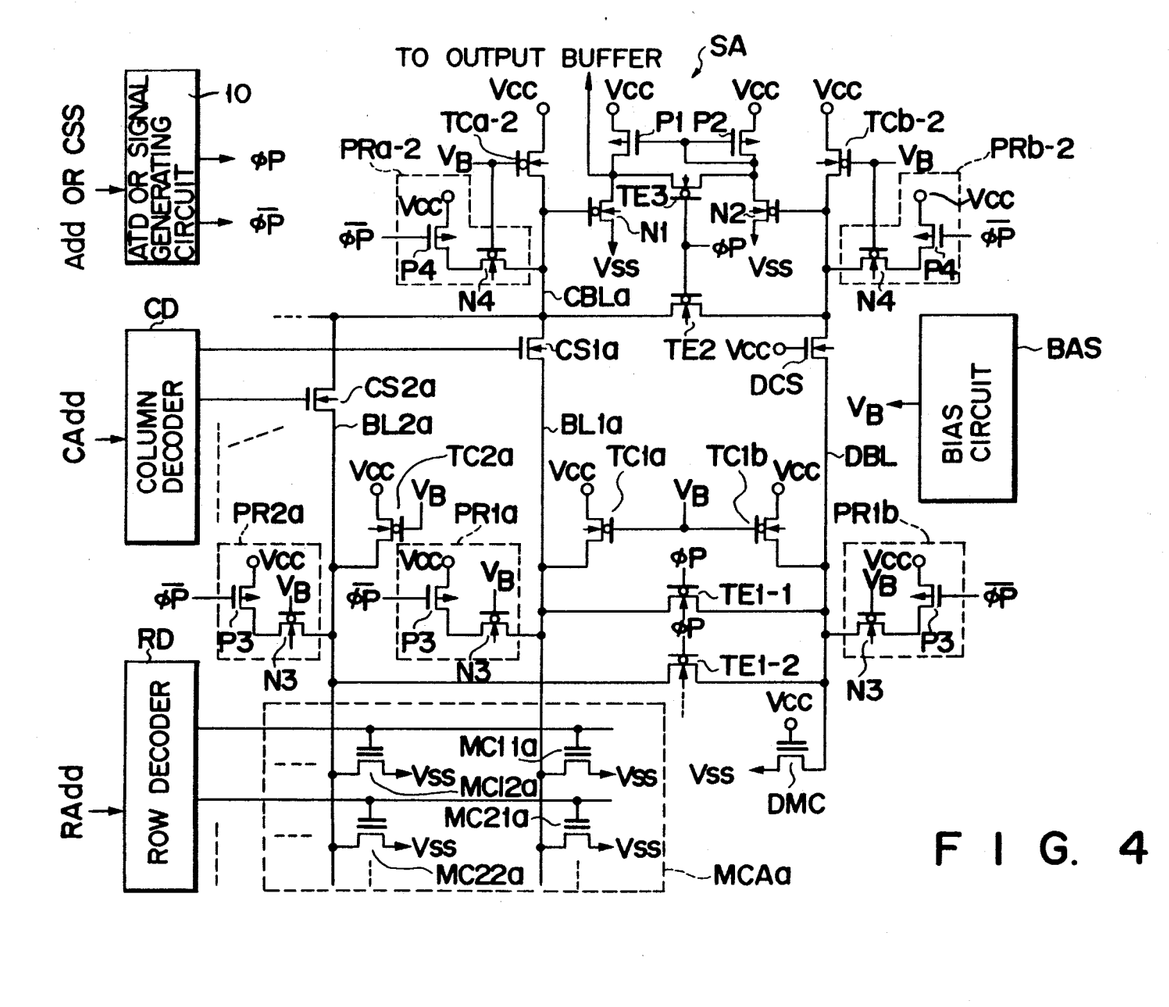
FIGS. 4 to 6 are circuit diagrams for describing semiconductor nonvolatile memory devices according to second to fourth embodiments of the present invention, and show parts of EPROMs.

FIG. 4 shows a part of the structure of an EPROM or a semiconductor nonvolatile memory device according to a second embodiment of the invention. The EPROM shown in FIG. 1 employs a two cell/one bit system, whereas the circuit of FIG. 4 is designed to store one bit by means of one memory cell. Namely, the second memory cell array MCAb in the circuit of FIG. 1 is replaced with a dummy cell DMC. A power source potential Vcc is applied to a control gate of the dummy cell DMC. The source of the dummy cell DMC is connected to a ground potential Vss, and the drain of the dummy cell DMC is connected to a dummy bit line DBL. A current path of a MOS transistor DCS, which is equivalent to column selection MOS transistors CS1a, CS2a . . . , is connected between the dummy bit line DBL and one of the input nodes of the sense amplifier SA. The gate of the MOS transistor DCS is constantly turned on by application of a power source potential Vcc.

The other structure of the circuit of FIG. 4 is the same as that of the circuit of FIG. 1. Common elements are denoted by the same reference numerals, and detailed descriptions thereof may be omitted here.

The operation of the circuit of FIG. 4 is basically identical to that of the circuit of FIG. 1, excepting that at the time of data readout the potential of a selected memory cell MCa is compared with that of the dummy cell DMC by the sense amplifier SA. With the structure shown in FIG. 4, there is also provided a semiconductor nonvolatile memory device having a data sense circuit capable of reading storage data at high speed, without lowering the data hold reliability of memory cells.

Figure 5:
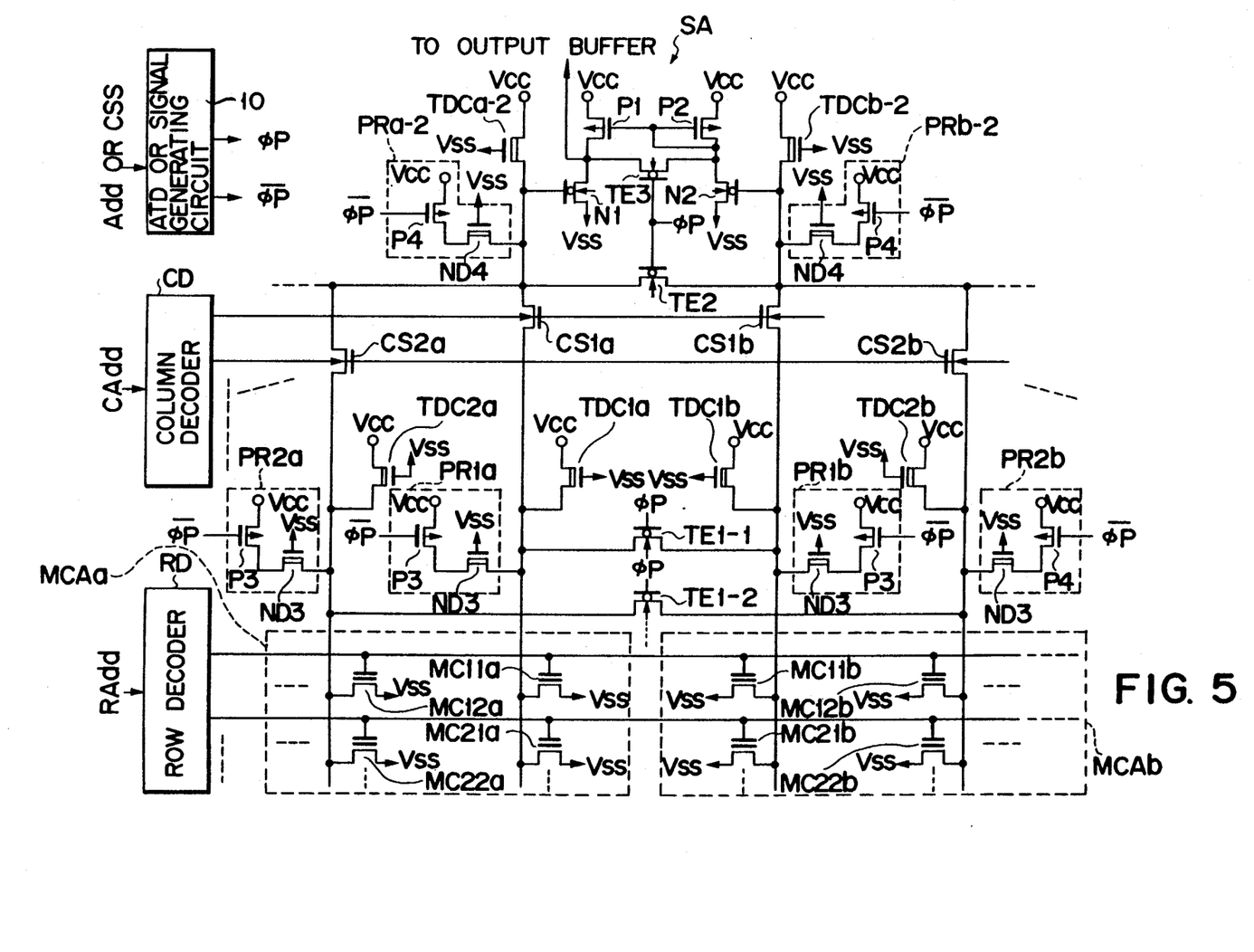
Figure 6:
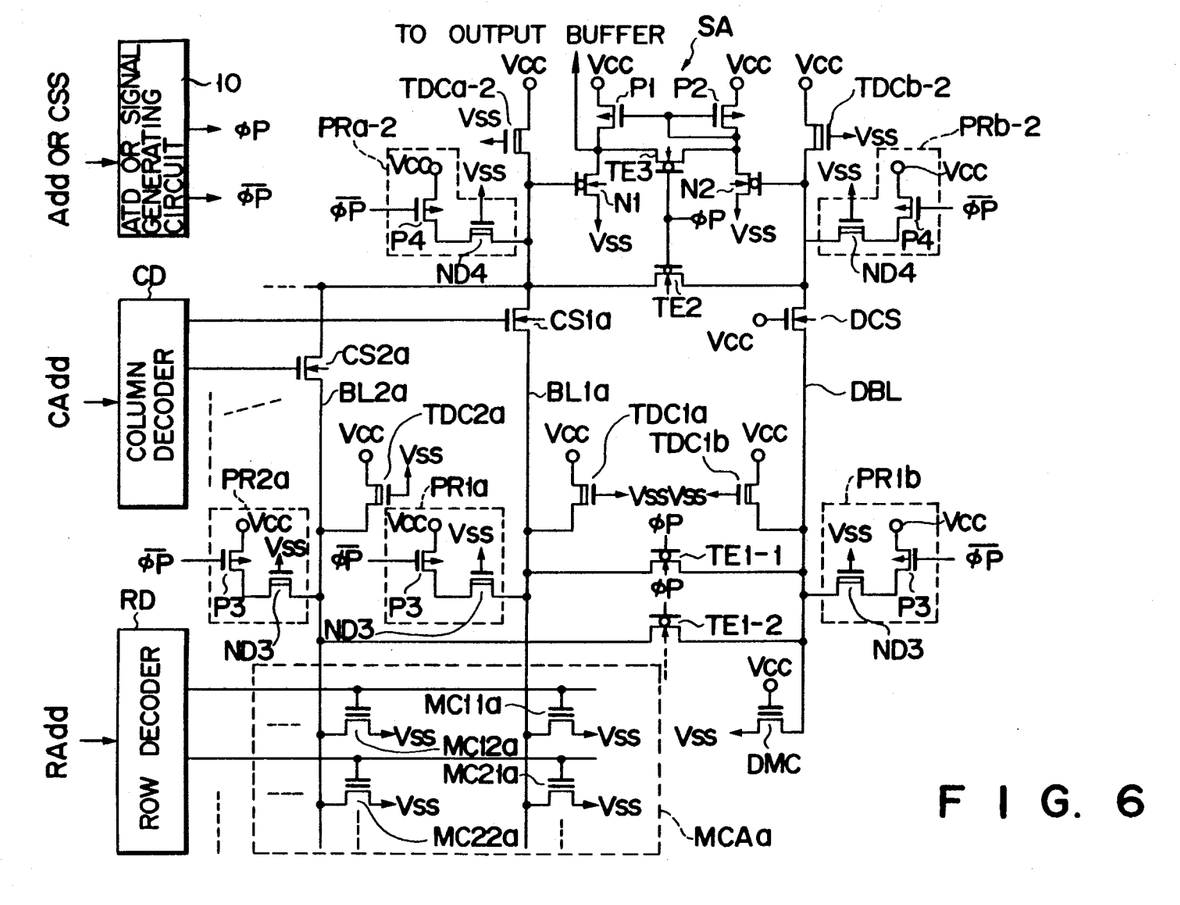

FIGS. 5 and 6 show third and fourth embodiments of the present invention, and both figures show parts of structures of EPROMs or semiconductor nonvolatile memory devices according to these embodiments. In the circuit shown in FIG. 5, the intrinsic-type MOS transistors in the circuit of FIG. 1 are replaced with depletion-type MOS transistors. Namely, the first N-channel MOS transistor TC1a, TC2a . . . TC1b, TC2b for clamping column potential, the second N-channel MOS transistors TCa-1 and TCb-2 for clamping column potential, the N-channel MOS transistors N3 in the first column line precharge circuits PR1a, PR2a . . . PR1b, PR2b . . . , and the N-channel MOS transistors N4 in the second column line precharge circuits PRa-2 and PRb-2 are all replaced with depletion-type N-channel MOS transistors TDC1a, TDC2a . . . TDC1b, TDC2b . . . , TDCa-2, TDCb-2, ND3 and ND4. A ground potential Vss is connected to the gates of these depletion-type MOS transistors TDC1a, TDC2a . . . TDC1b, TDC2b . . . , TDCa-2, TDCb-2, ND3 and ND4.

Similarly, in the circuit shown in FIG. 6, the intrinsic-type MOS transistors in the circuit shown in FIG. 4 are replaced with depletion-type MOS transistors.

The EPROMs shown in FIGS. 5 and 6 can achieve substantially the same advantages as those shown in FIGS. 1 and 4. In addition, since the depletion-type MOS transistors are used in the circuits of FIGS. 5 and 6, the bias circuit used in the circuit of FIG. 1 or 4 is needless, and the circuit structure is simplified.

Figure 7:
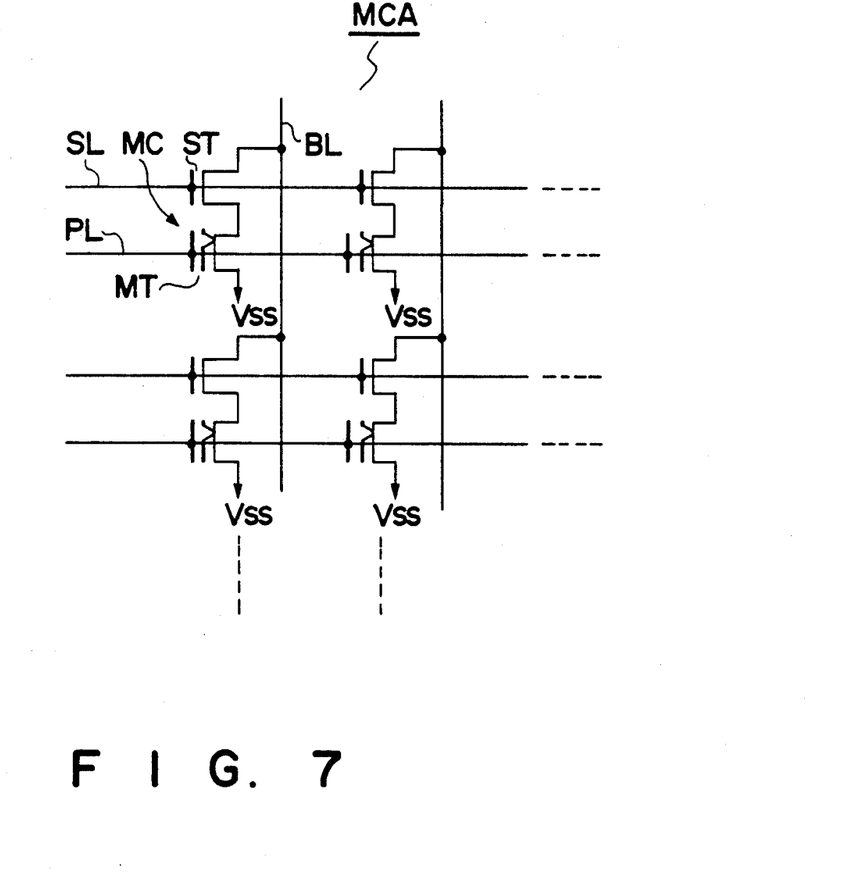
FIG. 7 is a circuit diagram for describing a semiconductor nonvolatile memory device according to a fifth embodiment of the invention, and shows a memory cell array of an EEPROM.

The above embodiments are directed to EPROMs; however, this invention is applicable to an EEPROM as shown in FIG. 7. In the EEPROM, the memory cell MC comprises a MOS transistor ST for selection and a transistor MT for data storage. The drain of the MOS transistor ST is connected to the column line BL, and the gate thereof is connected to a selection line SL. The drain of the transistor MT for storage is connected to the source of the MOS transistor ST, the source thereof is connected to a ground potential Vss, and the control gate thereof is connected to a program line PL.

The memory cell array MCA having the structure shown in FIG. 7 may be substituted for the memory cell array MCAa or MCAb in the circuits of FIGS. 1, 4, 5 and 6. In this case, only the structure of the row decoder RD slightly changes, and substantially the same data readout operation, as in the above embodiments, can be performed, with the same advantages.

What is claimed is:

1. A non-volatile semiconductor memory device comprising:
   first and second memory cell arrays, each of said first and second memory cell arrays comprising a plurality of nonvolatile memory cells arranged in respective corresponding row and column matrices;

row decoder means for decoding a row address signal and selecting a row of memory cells in said first and second memory cell arrays;

first column selection transistors, each first column selection transistor having a gate, a first terminal coupled to a corresponding column of memory cells in said first memory cell array, and a second terminal coupled to a first common connection node;

second column selection transistors, each second column selection transistor having a gate, a first terminal coupled to a corresponding column of memory cells in said second memory cell array, and a second terminal coupled to a second common connection node;

column decoder means for decoding a column address signal and selecting one of said first column selecting transistors and one of said second column selection transistors by supplying a selection signal to the respective gates thereof;

first clamping transistors for clamping a column potential, each first clamping transistor having a first terminal coupled to a corresponding column of memory cells, a second terminal coupled to a power source Vcc, and a gate supplied with a bias potential lower than the potential of said power source Vcc;

second clamping transistors for clamping a column potential, each of said second clamping transistors having a first terminal coupled to one of said common connection nodes, a second terminal coupled to the power source Vcc, and a gate supplied with said bias potential;

first precharge means responsive to a precharge signal for precharging each column of memory cells in said first and second memory cell arrays to a predetermined potential lower than said power supply Vcc;

sense amplifier means having a first input node connected to the first common connection node of said first column selection transistors, a second input node connected to the second common connection node of said second column selection transistors, and first and second output nodes, said sense amplifier sensing and amplifying data read out from memory cells in said first and second memory cell arrays selected by said row and column decoder means;

load means for loading the first and second input nodes of said sense amplifier, said load means including a first transistor having a gate supplied with the bias potential and a current path connected between said first input node and said power supply Vcc and a second transistor having a gate supplied with the bias potential and a current path connected between said second input node and said power supply Vcc;

second precharge means responsive to the precharge signal for precharging the first and second input nodes of said sense amplifier to a predetermined potential lower than said power supply Vcc;

first equalizing means responsive to an equalizes signal for equalizing a potential of the first and second input nodes of said sense amplifier;

second equalizing means responsive to the equalizes signal for equalizing potentials of column lines coupled to said first memory cell array and column lines coupled to said second memory cell array;

third equalizing means responsive to the equalizes signal for equalizing a potential of the first and second output nodes of said sense amplifier; and a control circuit for generating the equalize signal and the precharge signal in response to one or the other of an address transition signal and a memory selection signal, said control circuit controlling said first, second, and third equalizing means with the equalize signal and controlling said first and second precharging means with the precharge control signal, wherein the precharge signal and the equalize signal are inverted with respect to each other.

2. The device according to claim 1, wherein said sense amplifier means includes a current-mirror type differential amplifier.

3. The device according to claim 2, wherein said differential amplifier includes first and second intrinsic-type N channel MOS transistors for input, and first and second P-channel MOS transistors connected in a current-mirror manner and serving as loads.

4. The device according to claim 2, wherein said differential amplifier includes first and second depletion-type N-channel MOS transistors for input, and first and second P channel MOS transistors connected in a current-mirror manner and serving as loads.

5. The device according to claim 1, wherein said transistors for clamping column potential and said load transistors are intrinsic-type N-channel MOS transistors, the gates thereof being supplied with said bias potential.

6. The device according to claim 1, wherein said first and second transistors for clamping column potential are depletion-type N-channel MOS transistors, the gates thereof being supplied with a ground potential.

7. The device according to claim 1, wherein said equalize control circuit comprises an address transition detector for generating the equalize control signal in response to a transition in an address signal.

8. The device according to claim 1, wherein said equalize control circuit comprises a signal generating circuit for generating the equalize control signal in response to a memory selection signal.

9. A semiconductor nonvolatile memory device comprising:

a memory cell array in which nonvolatile memory cells are arranged in a matrix;

row decoder means for decoding a row address signal and selecting a corresponding row of memory cells in said memory cell array;

column selection transistors, coupled at one end to separate columns of memory cells in said memory cell array and at the other end to a common connection node;

column decoder means for decoding a column address signal and selecting one of said column selection transistors;

first clamping transistors for clamping a column potential, each having a first terminal coupled to a corresponding column of memory cells, a second terminal coupled to a power source Vcc, and a gate supplied with a bias potential lower than the potential of said power source Vcc;

a dummy cell;

a dummy cell selection transistor coupled to said dummy cell and having a first terminal coupled to a dummy bit line, a second terminal, and a gate coupled to said power source Vcc;

a second clamping transistor for clamping a potential of said dummy bit line and, coupled to said dummy line and said power source Vcc, and a gate of said second clamping transistor supplied with said bias potential;

first precharge means responsive to a precharge signal for precharging each column of said memory cells in said memory cell array and said dummy bit line to a potential lower than said power supply Vcc;

sense amplifier means having a first input node connected to the common connection node of said column selection transistors, a second input node connected to the second terminal of said dummy cell selection transistor, and first and second output nodes, said sense amplifier sensing and amplifying data read out from said memory cells selected by said row and column decoder means and data read out from the dummy cell;

load means for loading the first and second input nodes of said sense amplifier, said load means including a first transistor having a gate supplied with said bias potential and a current path connected between said first input node and said power supply Vcc and a second transistor having a gate supplied with said bias potential and a current path connected between said second input node and said power supply Vcc;

second precharge means responsive to the precharge signal for precharging the first and second input nodes of said sense amplifier to a potential lower than said power supply Vcc;

first equalizing means responsive to an equalizes signal for equalizing a potential of the first and second input nodes of said sense amplifier;

second equalizing means responsive to the equalizes signal for equalizing potentials of column lines coupled to said first memory cell array and the second terminal of said dummy cell selection transistor;

third equalizing means responsive to the equalizes signal for equalizing a potential of the first and second output nodes of said sense amplifier; and a control circuit for generating the equalize signal and the precharge signal in response to one or the other of an address transition signal and a memory selection signal, said control circuit controlling said first, second, and third equalizing means in accordance with the equalize signal, and controlling said first and second precharging means in accordance with the precharge signal, wherein the equalize signal and the precharge signal are inverted with respect to each other.

10. The device according to claim 9, wherein said sense amplifier means includes a current-mirror type differential amplifier.

11. The device according to claim 10, wherein said differential amplifier includes first and second intrinsic-type N channel MOS transistors for input, and first and second P-channel MOS transistors connected in a current-mirror manner and serving as loads.

12. The device according to claim 10, wherein said differential amplifier includes first and second depletion-type N-channel MOS transistors for input, and first and second P channel MOS transistors connected in a current-mirror manner and serving as loads.

13. The device according to claim 9, wherein said first and second transistors for clamping column potential are intrinsic-type N-channel MOS transistors, the gates thereof being supplied with said bias potential.

14. The device according to claim 9, wherein said first and second transistors for clamping column potential are depletion-type N-channel MOS transistors, the gates thereof being supplied with a ground potential.

15. The device according to claim 9, wherein said equalize control circuit comprises an address transition detector for generating the equalize control signal in response to a transition in an address signal.

16. The device according to claim 9, wherein said equalize control circuit comprises a signal generating circuit for generating the equalize control signal in response to a memory selection signal.

* * * * *

UNITED STATES PATENT AND TRADEMARK OFFICE
CERTIFICATE OF CORRECTION

PATENT NO. : 5,237,534
DATED : August 17, 1993
INVENTOR(S) : Sumio TANAKA and Toshiyuki SAKO It is certified that error appears in the above-indentified patent and that said Letters Patent is hereby corrected as shown below:

On the cover page, in section [75], please change

"Sanko" to --Sako--.

Signed and Sealed this

Nineteenth Day of April, 1994

Attest:

BRUCE LEHMAN

Attesting Officer      Commissioner of Patents and Trademarks